(12) United States Patent
Walden

(10) Patent No.: US 6,310,520 B1
(45) Date of Patent: Oct. 30, 2001

(54) HIGH SLEW-RATE OPERATIONAL AMPLIFIER ARCHITECTURE

(75) Inventor: Robert W. Walden, Bethlehem, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/537,300

(22) Filed: Mar. 29, 2000

(51) Int. Cl.$^7$ ............................... H03F 3/68; H03F 3/45
(52) U.S. Cl. ................................ 330/295; 330/253
(58) Field of Search ................ 330/9, 51, 69, 330/124 D, 124 R, 253, 295

(56) References Cited

U.S. PATENT DOCUMENTS 5,880,627 * 3/1999 Thiel ............................ 330/253 X

* cited by examiner

*Primary Examiner*—Steven J. Mottola

(57) ABSTRACT

An amplifier architecture wherein a primary or main operational amplifier is combined with a secondary or auxiliary high power operational amplifier to maintain the charge on a large load capacitor which operates as voltage reference source for a high precision analog circuit module. The auxiliary amplifier is activated only during brief periods for which a very high slew rate is required. This is achieved by additionally including a control circuit which regulates the operation of the auxiliary amplifier so that it operates only during very short intervals of very high load while the main operational amplifier accommodates all other normal operating conditions.

35 Claims, 6 Drawing Sheets

HIGH SLEW-RATE OPERATIONAL AMPLIFIER ARCHITECTURE

BACKGROUND OF THE INVENTION

1. Field of the Invention

This invention relates generally to operational amplifiers and more particularly to a high precision operational amplifier which is intermittently operational and providing a low quiescent power requirement when in a standby state while providing a high slew rate when activated.

2. Description of Related Art

One of the challenges for wireless communications apparatus currently being developed and implemented with integrated circuits is to keep both active and standby power consumption low. For standby operation, circuits are turned on very briefly and then powered down as quickly as possible to minimize power consumption. However, for high precision analog circuit modules, such as analog to digital and digital to analog converters, reference voltage sources are often required for which large filter capacitors are employed to maintain low noise levels. In such instances, there are typically two choices for intermittent operation: (1) maintain buffering of the capacitor voltage between activity bursts; or (2) utilize a high slew rate to quickly recharge the capacitor at the beginning of each activity burst. The first option requires that reference and buffer circuits remain powered up continuously between bursts, while the second option requires that it must be possible to recharge the capacitor, typically in the range of 1 nF to 1 uF, quickly at the beginning of each activity burst. For some systems, the rapid recharge of the capacitor can require peak currents of 100 to 1000 times what is necessary to maintain the charge in normal operation. In both instances, power dissipation presents a formidable problem and in some instances can be excessive.

SUMMARY

Accordingly, it is an object of the present invention to provide an improvement in operational amplifiers where it is necessary to keep both active and standby power consumption at a relatively low level.

It is another object of the invention to provide an improvement in high precision analog circuit modules comprised of operational amplifiers.

It is still another object of the invention to provide an improvement in operational amplifiers implemented with semiconductor devices including MOS transistors CMOS transistors, and bipolar transistors.

It is still yet another object of the invention to provide a high precision analog circuit module including one or more voltage reference sources including relatively large capacitors which must maintain a reference voltage continuously or quickly recharged at the beginning of an operational mode.

Briefly, the foregoing and other objects are achieved by combining a conventional operational amplifier with a secondary high power operational amplifier that is activated only during brief periods for which a very high slew rate is required to charge a load capacitor which operates as a voltage reference source. This is achieved by an amplifier architecture which is comprised of a capacitor load circuit for providing an output voltage of a predetermined amplitude; a first operational amplifier circuit, operable as a main amplifier, connected to the load circuit for powering the load circuit under normal operating condition; and a second operational amplifier circuit, operable as an auxiliary amplifier, connected to the load circuit for additionally powering the load circuit together with the main amplifier during relatively short intervals and where a relatively high slew rate is required for the output voltage. The amplifier architecture is preferably implemented in one or more integrated circuits.

Further scope of applicability of the present invention will become apparent from the detailed description provided hereinafter. It should be understood, however, that the detailed description and specific examples, while disclosing the preferred embodiments of the invention, they are provided by way of illustration only, since various changes and modifications coming within the spirit and scope of the invention will become apparent to those skilled in the art from the following detailed description.

BRIEF DESCRIPTION OF THE DRAWINGS

The present invention will become more fully understood from the detailed description found herein below and the accompanying drawings which are provided by way of illustration only, and thus are not meant to limit the present invention, and wherein.

DETAILED DESCRIPTION OF THE PREFERRED EMBODIMENTS

The present invention is directed to apparatus for overcoming the deficiencies present in prior art reference voltage sources utilized in connection with high precision analog circuit modules, having one or more intermittently active operational amplifiers charging an output load capacitor.

Figure 1:
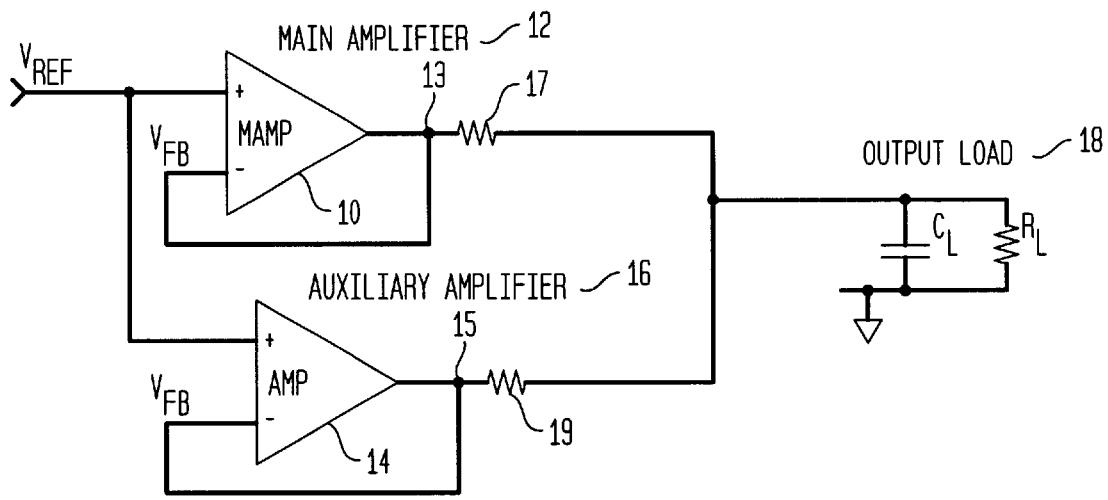
FIG. 1 is a schematic diagram broadly illustrative of a first embodiment of the invention used for supplying a single polarity of high output current to a capacitive type load in accordance with the subject invention.

Referring now to the drawing figures and more particularly to FIG. 1, broadly disclosure thereat is a first embodiment of the invention including a single operational amplifier 10 which operates as a main amplifier (MAMP) 12 and a single second power operational amplifier 14 which operates as an auxiliary amplifier (AUXAMP) 16. Auxiliary amplifier 16 is used only during brief periods for which a high slew rate is required to recharge a load capacitor $C_L$ of an output load 18 also including a parallel load resistor $R_L$. The main amplifier 12 is designed to accommodate normal operating conditions while the auxiliary amplifier 16 is intended to operate only during short intervals of very high load. Both operational amplifiers 10 and 14 are shown comprised of feedback amplifiers where the positive (+) input port of both amplifiers are commonly connected to an input signal comprising a voltage reference VREF, while their negative (-) input ports are coupled to a feedback signal VFB comprising the output voltage appearing at circuit nodes 13 and 15 common to the respective output ports. The outputs of the two amplifiers 10 and 14 are coupled to the output load 18 via resistors 17 and 19. The circuit shown in FIG. 1 would be used, for example, for charging the load capacitor $C_L$ by a high output current of a single polarity, with the auxiliary amplifier 16 being operable so to become active only when the output voltage falls below the reference voltage $V_{REF}$.

Figure 2:
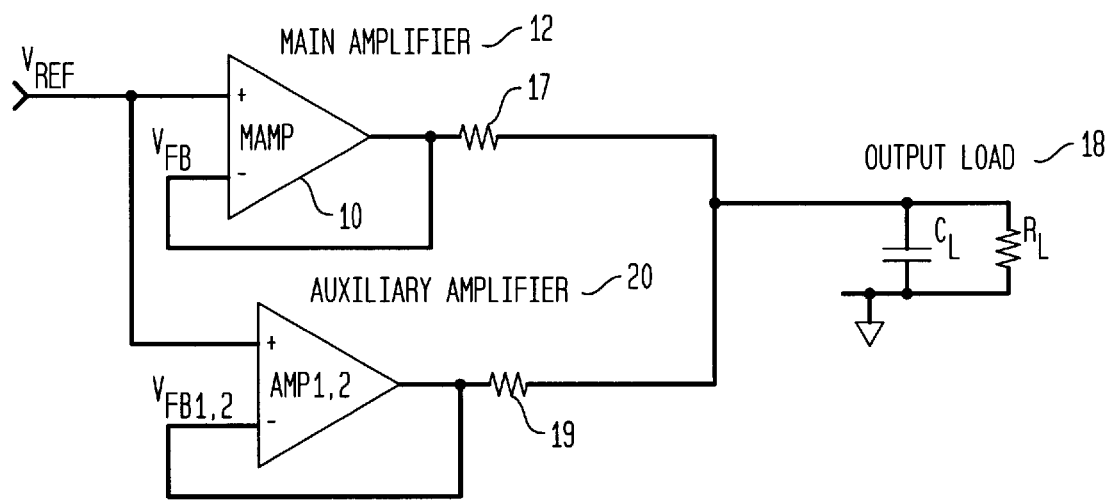
FIG. 2 is a schematic diagram broadly illustrative of a second embodiment of the subject invention used for supplying a dual polarity of high output current to a capacitive load in accordance with the subject invention.
Figure 3:
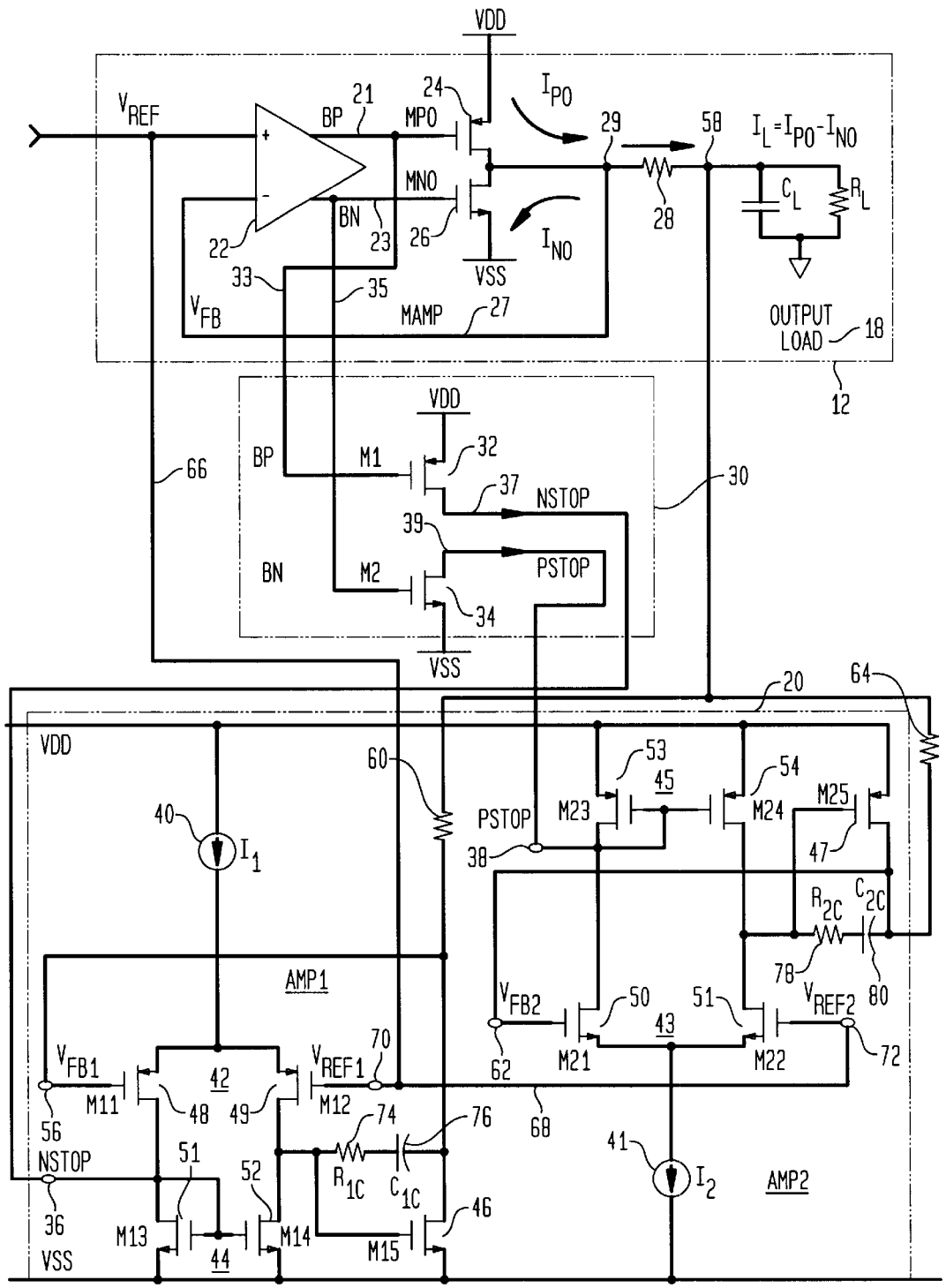
FIG. 3 is an electrical schematic diagram illustrating the details of the embodiment shown in FIG. 2.

When a dual polarity charging current for load capacitor $C_L$ is desired, an auxiliary amplifier 20 as shown in FIG. 2 would be utilized and consists of two separate amplifiers AMP1 and AMP2, the details of which are shown in FIG. 3, which are suitably biased such that one amplifier is active when the output voltage is above the input reference $V_{REF}$, and the other amplifier is active when the output voltage is below the reference voltage $V_{REF}$. The details of such a configuration is shown in FIG. 3.

Referring now to FIG. 3, the main amplifier (MAMP) 12 is comprised of a conventional class-AB operational amplifier which is capable of stable operation with a high capacitance output load 14, as before. MAMP 12 includes an operational amplifier 22 and a pair of series connected metal oxide silicon field effect (MOS) output transistors MPO and MNO which are also identified by reference numerals 24 and 26. The gate electrodes of MPO and MNO transistors 24 and 26 are connected to bias signals BP and BN from the operational amplifier 22 by circuit leads 21 and 23. The drain electrodes of output transistors 24 and 26 are commonly connected to one side of a resistor 28 which couples positive and negative going charging currents $I_{PO}$ and $I_{NO}$ to the load 18. A feedback voltage VFB is coupled back to the (-) input port of operational amplifier 22 by way of a circuit lead 27 from circuit node 29.

With a reference input voltage $V_{REF}$ applied to the (+) input port of the operational amplifier 22, when the output voltage at node 29 drops below $V_{REF}$, MPO transistor 24 becomes conductive so as to deliver a positive polarity output current $I_{PO}$ to the load 18. When the output voltage at node 28 exceeds the reference voltage $V_{REF}$, MNO transistor 26 becomes conductive, causing a negative polarity of output current $I_{NO}$, whereupon the voltage across the capacitor CL to decrease.

When both MPO and MNO transistors 24 and 26 are conducting the load current $I_L$ is the difference between $I_{PO}$ and $I_{NO}$ as shown. However, during brief periods for which a very high slew rate is required to quickly charge or recharge the load capacitor $C_L$ at the beginning of a period of activity, additional charging current is provided by either AMP1 or AMP2 of auxiliary amplifier 20 in response to feedback control signals NSTOP and PSTOP generated by a control circuit 30 including a pair of MOS transistors M1 and M2, which are designated by reference numerals 32 and 34, respectively. As further shown in FIG. 3, the gate electrodes of M1 and M2 are respectively connected to BP and BN signal outputs of operational amplifier 22 by circuit leads 33 and 35.

The drain electrode of M1 is connected to circuit node 36 of AMP1 via lead 37, while the drain electrode of M2 is coupled to circuit node 38 of AMP2 via lead 39. The two amplifiers AMP1 and AMP2 of the auxiliary amplifier 20 are complimentary and are comprised of $I_1$ and $I_2$ current sources 40 and 41, a differential input pair of transistors 42 and 43, current mirrors 44 and 45 and output transistors 46 and 47. AMP1 and AMP2 include MOS transistors M1, M12 (reference numerals 48 and 49), and M21, M22 (reference numerals 50 and 51). The current mirrors 44 and 45 consist of MOS transistors M13, M14 (reference numerals 51 and 52) and M23, M24 (reference numerals 53 and 54).

It can be seen that the drain electrode of the output transistor M15 (reference numeral 46) of AMP1 is connected to circuit node 56 for coupling a first feedback signal $V_{FB1}$ to the gate of MOS transistor M11, as well as to circuit node 58 of the load capacitor $C_L$ via resistor 60. In a like fashion, the drain electrode of output transistor M25 of AMP2 is connected to circuit node 62 for providing a second feedback signal $V_{FB2}$ to the gate of MOS transistor M21. The drain electrode of transistor M25 is also connected to circuit node 70 of the output load 18 via resistor 74. The reference input voltage $V_{REF}$ is also commonly connected to the gate electrodes of MOS transistor M12 of AMP1 and the gate electrode of MOS transistor M22 of AMP2 by way of circuit leads 66 and 68 which connect to nodes 70 and 72.

Standard compensation techniques are also used to obtain feedback stability and rapid settling of transients for the main amplifier 10 and the auxiliary amplifier 20. For example, compensation components such as $R_{1C}$, $C_{1C}$ (reference numerals 74 and 76), and $R_{2C}$, $C_{2C}$ (reference numerals 78 and 80), are connected between the gate and drain electrodes of the output transistors M15 and M25 so as to provide amplifier stability for the output currents fed to the output load 18 of the main amplifier 12, and more particularly to the load capacitor $C_L$.

Considering now the operation of the embodiment of the invention shown in FIG. 3, during normal operation for which the auxiliary amplifier 20 is not required, transistors M1 and M2 of control circuit 30, which are preferentially much smaller than the transistors MPO and MNO of the main amplifier 10, each conduct current in response to bias voltages BP and BN fed to the gate electrodes of transistors M1 and M2 via circuit leads 33 and 35 from operational amplifier 22 of the main amplifier 12.

Figure 4A:
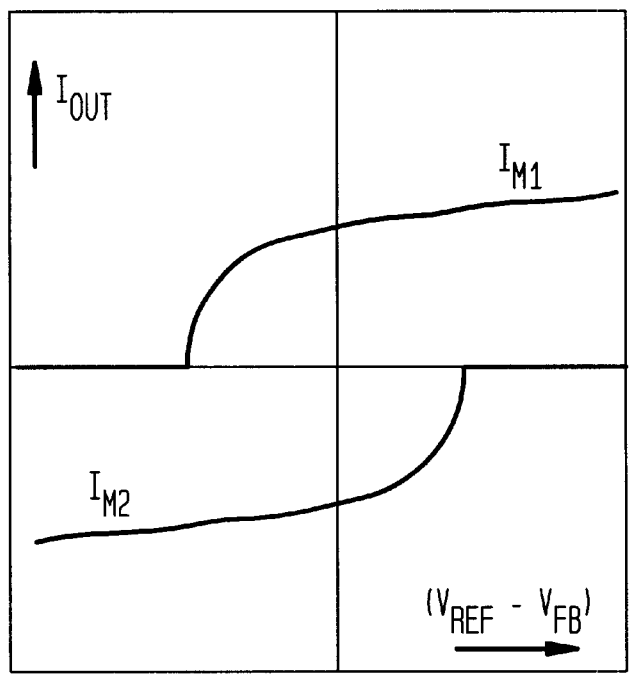
FIG. 4A is a current vs. voltage diagram depicting control currents for controlling the circuitry shown in FIG. 3.

When the feedback voltage VFB coupled to the (-) input port of amplifier 22 is higher than the reference input voltage $V_{REF}$, the bias voltages BP and BN rise, increasing the conductance of M2 while decreasing the conductance of M1. Conversely, when the voltage $V_{FB}$ is lower than the reference voltage $V_{REF}$, the bias voltages BP and BN fall, decreasing the conductance of M2 and increasing the conductance of M1. When the differential voltage ($V_{REF}-V_{FB}$) becomes large enough that the main amplifier 12 becomes slew rate limited, only one of the control transistors M1 or M2 remains conducting as illustrated in FIG. 4, which depicts the control currents $I_{M1}$, and $I_{M2}$ generated by the control circuit 30.

With the foregoing in mind, consider now an operational mode in which the main amplifier 12 is in normal operation where, for example, $V_{REF}=V_{FB}$. In this instance both control transistors M1 and M2, are conducting. Transistor M1 supplies $I_{M1}$, current which causes the NSTOP signal to rise. This increases the current through transistors M13, causing the gate voltage of M13 and M14 of AMP1 to rise, which in turn allows more current to flow through M14 from which the voltage on the gate of M15 drops, turning off output transistor M15. Thus, both AMP1 and AMP2 are inactive under these conditions and no auxiliary current is fed to the output load capacitor $C_L$.

Considering now the case where the main amplifier 12 is slewing upward where, for example, $V_{REF}>V_{FB}$, M1 is conducting heavily while M2 is non-conductive. This keeps the output transistor M15 of AMP1 cut off, but there is no longer current through M2 to inhibit the operation of AMP2. Accordingly, a large differential signal ($V_{REF}-V_{FB}$) appears across the inputs of AMP2 causing it to drive the output transistor M25 into strong conduction. In this mode, the output current of the auxiliary amplifier 20 fed to the capacitive output load 18 may be many times greater than that of the main amplifier 12.

Figure 4B:
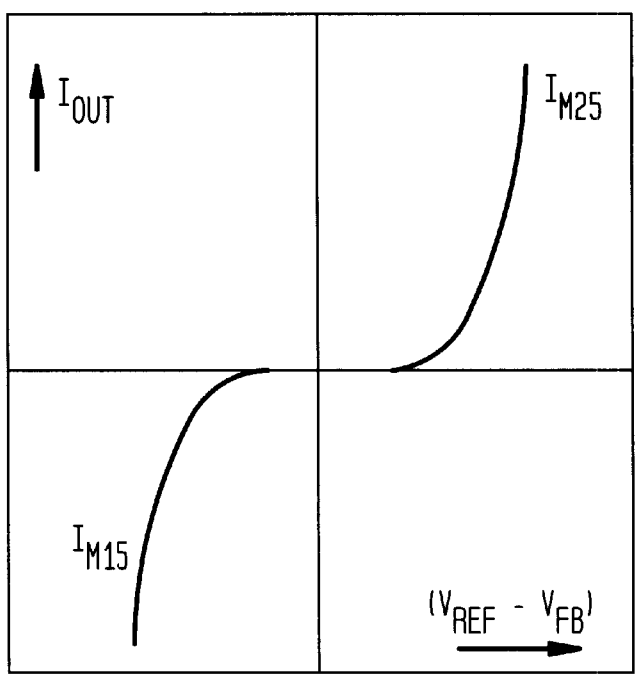
FIG. 4B is a current vs. voltage diagram depicting the output current from the circuitry shown in FIG. 3.

For the condition where the main amplifier 12 is slewing downward, i.e., where $V_{REF}<V_{FB}$, transistor M1 of the control circuit 20 becomes nonconductive while transistor M2 becomes heavily conductive. This maintains the output of AMP2 cut off while there is no current through M1 to inhibit the operation of AMP1. A large differential signal ($V_{FB}-V_{REF}$) across the inputs of AMP1 now causes it to drive the output transistor M15 into strong conduction. FIG. 4B is a current vs. voltage curve illustrating the output currents $I_{M15}$ and $I_{M25}$ of transistors M15 and M25 as a function of the differential input voltage to AMP1 and AMP2, respectively.

In order to avoid excessive power consumption and maintain stable operation, it is important that AMP1 and AMP2 drive the respective output transistors M15 and M25 only when the main amplifier 12 is slewing, and that AMP1 and AMP2 are not simultaneously driving the output load 18. Accordingly, the control signals PSTOP and NSTOP directly influence this domain of operation. While larger control currents $I_{M1}$, and $I_{M2}$ produce more stable operation, excessively large control currents result in longer settling times following AMP1 or AMP2 activity.

Where, for example, the operational amplifier 22 of the main amplifier 12 is a class-A amplifier, or in the instance where it comprises a class-AB amplifier but the transconductance from the main amplifier inputs to output MPO transistor 24 is significantly smaller than the transconductance to output MNO transistor 26, a variation of the control circuit 30 (FIG. 3) may be used. Such a circuit is illustrated in FIG. 5A.

Figure 5A:
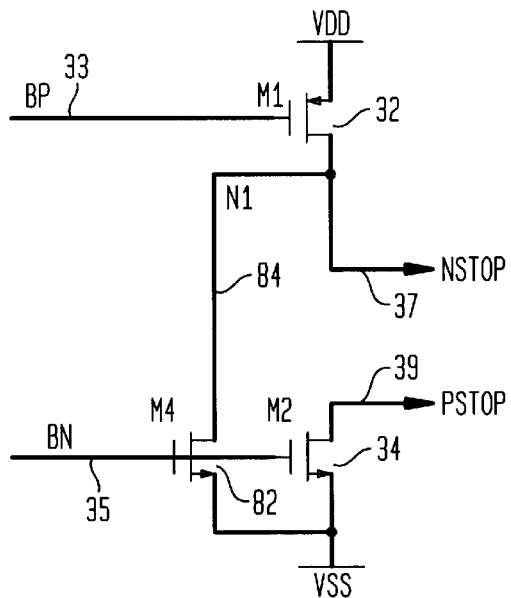
FIGS. 5A, 5B and 5C are illustrative of modifications of the control current generator circuitry shown in FIG. 3.
Figure 5B:
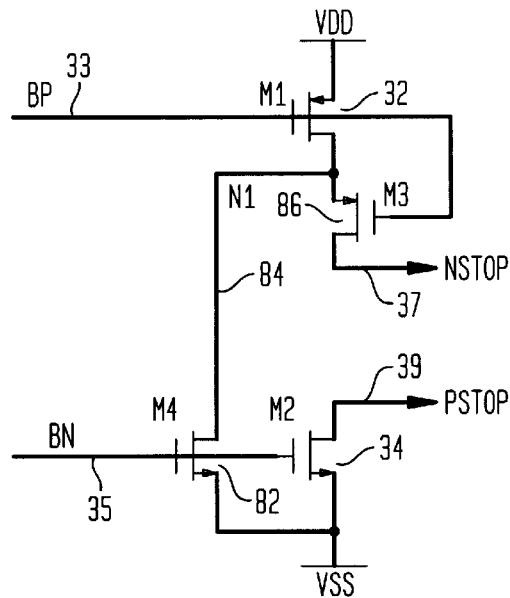
Figure 6:
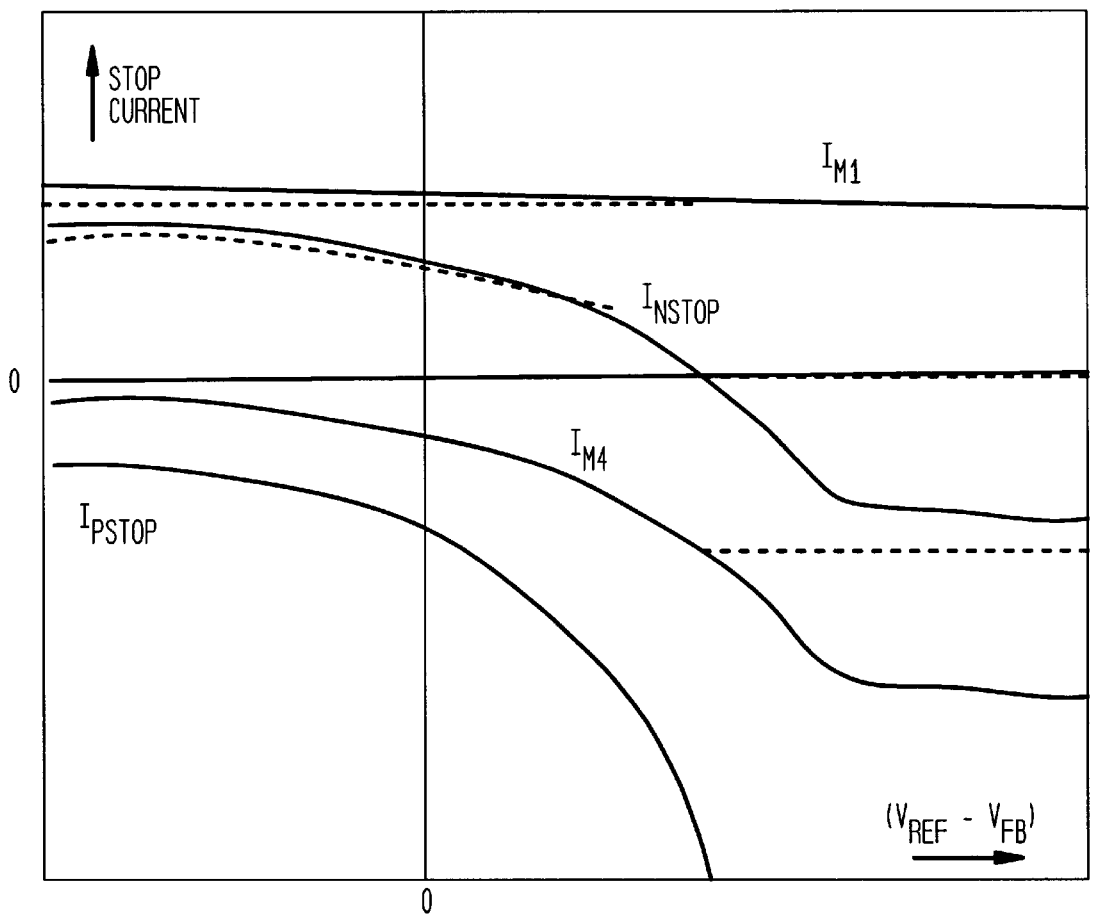
FIG. 6 is a current vs. voltage diagram illustrative of the "stop" currents for the circuits shown in FIGS. 5A–5C.

Referring now to FIG. 5A, a third MOS transistor M4 (reference numeral 82) has its gate electrode commonly connected to the gate electrode of M2, and is adapted to receive a bias voltage signal BN from the operational amplifier 22 shown in FIG. 3 via circuit lead 35. The source electrode of M4 is connected to the supply voltage $V_{ss}$ along with the source electrode of M2. The drain electrode, however, is now connected to the drain electrode of M1 via a circuit lead N1 (reference numeral 84). In such a circuit, the control current $I_{NSTOP}$ on lead 37 is the difference of two currents, namely a larger current $I_{M1}$ coming from VDD through M1 and a smaller current $I_{M4}$ through M4 to $V_{ss}$ and is depicted in FIG. 6.

Also additional enhancements may improve dynamic performance in some situations. For example, as shown in FIG. 6B, the addition of a fourth control MOS transistor M3 (reference numeral 86), may improve stability or settling time for some output load conditions. Transistor M3 operates to inhibit the reverse flow of current from NSTOP circuit lead 37 through M4. Circuit operation as modified is illustrated by the dashed lines of FIG. 6.

Figure 5C:
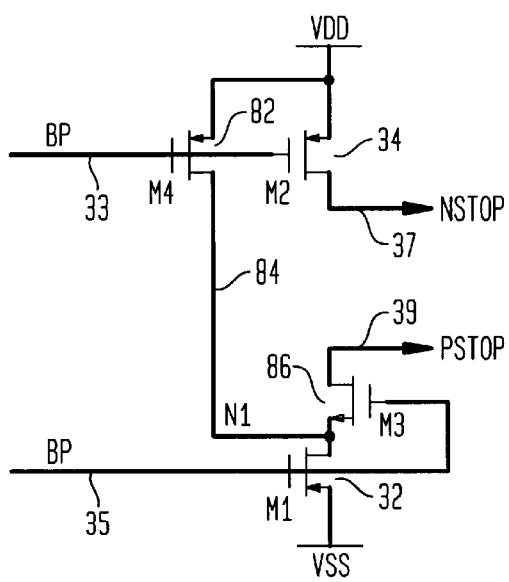

With respect to the circuit shown in FIG. 5C, transistor M4 is moved up with transistor M2 and circuit lead 84 from the drain of M4 now connects between the source and drain electrodes of M3 and M1 and operates to inhibit reverse flow of current from PSTOP circuit lead 39 through M4 whose gate electrode is now connected to the BP signal lead 88.

The embodiment of the invention shown in FIG. 3 may also be modified to include one or more components which shift the differential voltage ($V_{REF}-V_{FB}$) at which AMP1 or AMP2 starts to become active. This is shown schematically in FIG. 7 where the differential input pair of transistors 42' and 43' include resistors $R_{11OS}$ and $R_{12OS}$ (reference numerals 88 and 89) to the source electrodes of MOS transistors M11 and M12. Also, amplifier 43' includes adding resistors $R_{21OS}$ and $R_{12OS}$ (reference numerals 90 and 91) to the source electrodes of M21 and M22.

Figure 7:
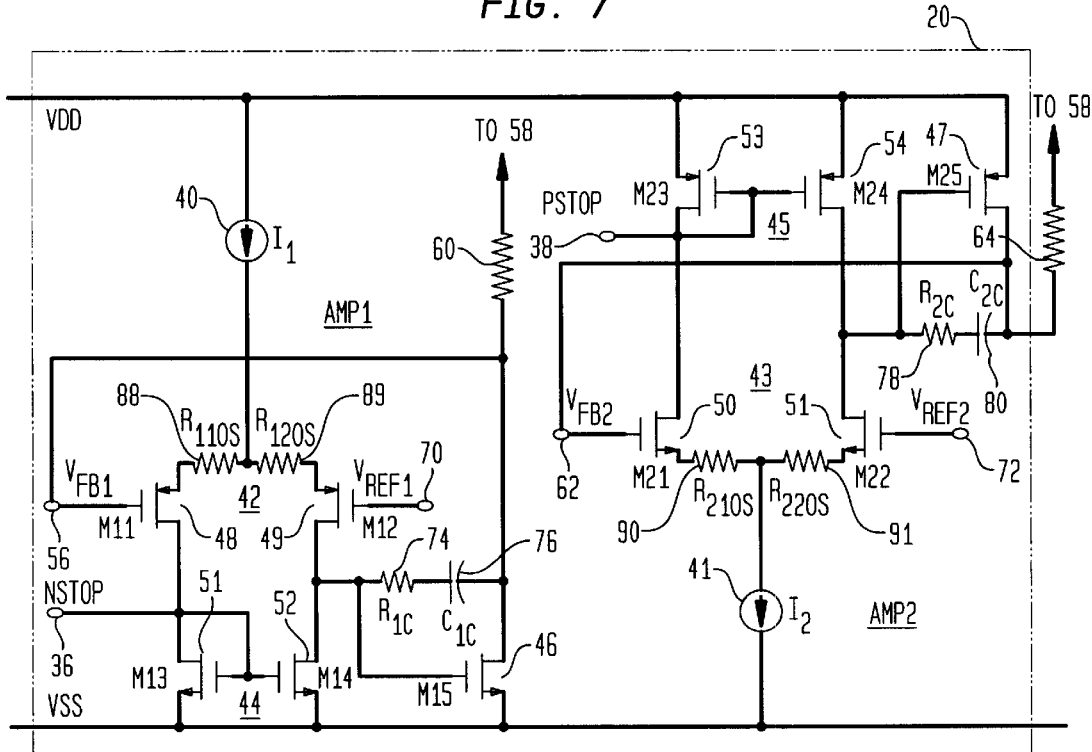
FIG. 7 is a schematic circuit illustrative of a modification of the auxiliary amplifier circuits shown in FIG. 3.
Figure 8:
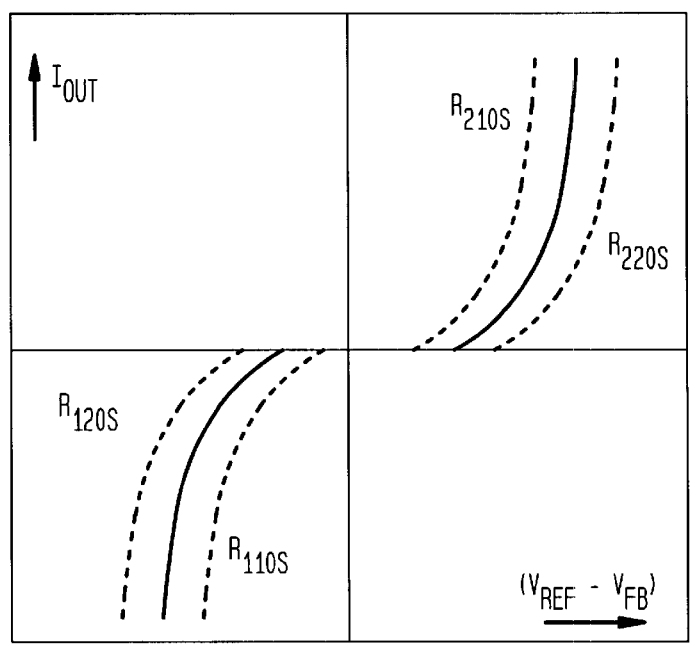
FIG. 8 depicts a current vs. voltage diagram illustrative of the effect of adding additional resistors to the circuitry shown in FIG. 7.

The effects of adding these resistors is illustrated in FIG. 7 which is a graph illustrative of output current vs. differential voltage. The solid line is illustrative of the output current characteristics where the resistors are absent, such as shown in FIG. 3, while the dashed lines illustrate the output current characteristics where the resistors are added. It also should be pointed out that similar effects may be achieved by adjustment of the sizes of the MOS transistors utilized in AMP1 and AMP2. Thus, there are any number of desired ways to fine tune performance or provide appropriate margin for AMP1 or AMP2 input offset caused by random device mismatches expected for fabricated circuits.

In the preferred embodiment of the invention as shown in FIG. 3, $V_{REF}$, $V_{REF1}$ and $V_{REF2}$ are all the same reference voltage; however, separate feedback networks are utilized for the main amplifier 12 and the auxiliary amplifier 20 so as to improve performance, particularly where the output load 18 includes a large capacitance $C_L$ as shown in FIG. 3.

Figure 9A:
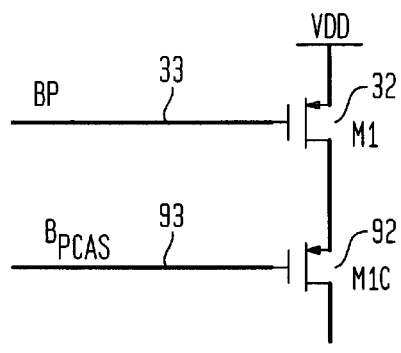
FIGS. 9A and 9B are illustrative of appropriately biased cascoded semiconductor devices which could be substituted for the active semiconductor devices shown in FIGS. 3 and 7.
Figure 9B:
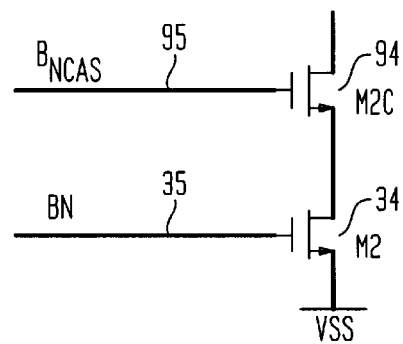

It should also be pointed out that any of the active devices in the circuitry disclosed herein may be replaced by appropriately biased cascoded devices. An example of this type of implementation is shown in FIGS. 9A and 9B where, for example, a second MOS transistor M1C (reference numeral 92) is connected in a well known cascode circuit arrangement with MOS transistor M1. In this case, two separate bias voltage signals BP and BpcAs are applied to the respective gate electrodes of M1 and M1C via circuit leads 33 and 93. Likewise, with respect to the circuit shown in FIG. 9B, a second MOS transistor M2C (reference numeral 94), is cascoded with MOS transistor M2. In this instance, separate bias potentials BN and BNCAS are applied to the gate electrodes of M2 and M2C via circuit leads 35 and 95.

It should also be pointed out that the embodiments of the invention in the foregoing detailed description are preferably implemented in one or more integrated circuits. Moreover, they are not limited simply to the use of MOS devices, but can be implemented with bipolar or biCMOS devices when desired.

Having thus shown and described what is at present considered to be the preferred embodiments of the invention, it should be noted that the same may be varied in still other ways and thus are not meant to be considered in a limiting sense. Accordingly, all modifications and alterations coming within the scope of the invention as set forth in the appended claims are herein meant to be included.

What is claimed is:

1. An amplifier architecture comprising:

A capacitive load circuit for providing an output voltage of a predetermined amplitude;

a first amplifier circuit, operable as a main amplifier, connected to the load circuit for powering the load circuit under normal operating condition;

a second amplifier circuit, operable as an auxiliary amplifier, connected to the load circuit for additionally powering the load circuit together with the main amplifier during relatively short intervals and where a relatively high slew rate is required for the output voltage; and, wherein said first and second amplifier circuits comprise same type amplifier circuits for powering the capacitance load circuit.

2. An amplifier architecture according to claim 1 wherein said first and second amplifier circuits are comprised of operational amplifier circuits.

3. An amplifier architecture according to claim 2 wherein said first and second amplifier circuits are embodied in one or more integrated circuits.

4. An amplifier architecture according to claim 2 wherein the load circuit includes a load capacitor which is charged by both said operational amplifiers.

5. An amplifier architecture according to claim 4 wherein said second amplifier includes amplifier circuitry for providing an output capacitor charging current of a single polarity.

6. An amplifier architecture according to claim 4 wherein said second amplifier includes amplifier circuitry for providing an output capacitor charging current of a dual polarity.

7. An amplifier architecture according to claim 6 wherein said second amplifier circuit includes a first auxiliary amplifier circuit which is active when the output voltage exceeds an input reference voltage and a second auxiliary amplifier which is active when the voltage falls below the input reference voltage.

8. An amplifier architecture according to claim 7 and additionally including a control circuit connected between the main amplifier and the first and second auxiliary amplifiers of the second amplifier circuit for controlling current fed to the load capacitor via said auxiliary amplifier circuits in response to an operational state of the main amplifier.

9. An amplifier architecture according to claim 8 wherein said first amplifier circuit comprises a dual input operational amplifier including a pair of output devices having a respective current conducting terminal commonly connected to the load capacitor, and wherein the input reference voltage is applied to one input of said operational amplifier and a feedback voltage appearing at a circuit node at a common connection of the respective current conducting terminals is applied to the other input of said operational amplifier.

10. An amplifier architecture according to claim 9 wherein said operational amplifier generates a pair of control signals and wherein said pair of output devices have control terminals respectively coupled to said pair of control signals to control current fed to and from the load capacitor.

11. An amplifier architecture according to claim 10 wherein said pair of output devices comprise a pair of semiconductor devices and wherein said pair of semiconductor devices each have another current conducting terminal respectively connected to a supply voltage.

12. An amplifier architecture according to claim 11 wherein said pair of semiconductor devices comprises a pair of transistors of mutually opposite semiconductivity type.

13. An amplifier architecture according to claim 10 and wherein said control circuit comprises a pair of current control devices respectively coupled to said pair of control signals generated by said operational amplifier of the main amplifier and a being operable to control current output of first and second auxiliary amplifier to said output capacitor.

14. An amplifier architecture according to claim 13 wherein said pair of current control devices comprise a pair of semiconductor devices, each said semiconductor device having a current control terminal and first and second current conducting terminals, and wherein said current control terminals are respectively connected to said pair of control signals from said operational amplifier, one current conducting terminal of said first and second current conducting terminals being respectively connected to the current control input terminal of said first and second auxiliary amplifier circuits and the other current conducting terminal of said first and second current conducting terminals being connected to a supply voltage.

15. An amplifier architecture according to claim 14 wherein said another pair of semiconductor devices also comprise a pair of transistors of mutually opposite semiconductivity type.

16. An amplifier architecture according to claim 13 wherein said first and second auxiliary amplifiers each include a current output device which is driven conductive in response to the conductive state of said pair of current control devices of said control circuit to supply current to said load capacitor.

17. An amplifier architecture according to claim 16 wherein said first and second auxiliary amplifiers include a mutually complementary amplifier circuit having first and second input terminals and an output terminal and wherein said first input terminals are coupled to an input reference voltage signal, said second input terminals are coupled to a feedback signal from a respective current output device, and said output terminals are respectively coupled to said load capacitor.

18. An amplifier architecture according to claim 17 wherein each said complementary amplifier circuit includes a pair of semiconductor devices each having a current control terminal and a first and a second current conducting terminal, and wherein the current control terminals are respectively connected to said first and second input terminal, said first current conducting terminals are commonly connected together to a current source and said second current conducting terminals are connected to a current mirror circuit.

19. An amplifier architecture according to claim 18 wherein said current output device, said amplifier circuit and said current mirror circuit of said first and second auxiliary amplifiers are comprised of semiconductor devices.

20. An architecture according to claim 19 wherein said semiconductor devices of said differential amplifiers and said current source circuits comprise transistors.

21. An amplifier architecture according to claim 13 wherein said control circuit includes at least one other current control device connected between said pair of current control devices for preventing said first and second auxiliary amplifiers from simultaneously supplying current to said output capacitor.

22. An amplifier architecture according to claim 21 wherein said control circuit includes another current control device for inhibiting a reverse flow of current through said one other current control device from one of said pair of current control devices.

23. An amplifier architecture according to claim 22 wherein said current control devices comprise semiconductor devices.

24. An amplifier architecture according to claim 23 wherein said semiconductor devices are comprised of transistors.

25. An integrated circuit comprising:
a capacitive load circuit for providing an output voltage of a predetermined amplitude;

a first amplifier circuit, operable as a main amplifier, connected to the load circuit for powering the load circuit under normal operating condition;

a second amplifier circuit, operable as an auxiliary amplifier, connected to the load circuit for additionally powering the load circuit together with the main amplifier during relatively short intervals and where a relatively high slew rate is required for the output voltage; and, wherein said first and second amplifier circuits comprise same type power amplifier circuits.

26. An integrated circuit according to claim 25 wherein said first and second amplifier circuits are comprised of operational amplifier circuits.

27. An amplifier architecture according to claim 26 wherein the load circuit includes a load capacitor which is charged by both said operational amplifiers.

28. An amplifier architecture according to claim 27 wherein said second amplifier circuit includes a first auxiliary amplifier circuit which is active when the output voltage exceeds an input reference voltage and a second auxiliary amplifier which is active when the voltage falls below the input reference voltage.

29. An amplifier architecture according to claim 28 and additionally including a control circuit connected between the main amplifier and the first and second auxiliary amplifiers of the second amplifier circuit for controlling current fed to the load capacitor via said auxiliary amplifier circuits in response to an operational state of the main amplifier.

30. A method of powering an intermittently used reference voltage source including a load capacitor, comprising the steps of:

supplying power to charge the load capacitor to a predetermined voltage from a first source of current during a first operational mode;

additionally supplying power to the load capacitor from a second source of current during a second operational mode occurring during intermittent relatively short time intervals where a relatively high slew rate of charge to said predetermined voltage is required; and, wherein the first and second source of current are comprised of same type power amplifiers.

31. A method according to claim 30 wherein said first source of current comprises a main operational amplifier and said second source of current comprises an auxiliary operational amplifier.

32. A method according to claim 31 wherein said main operational amplifier and said auxiliary operational amplifier are implemented by one or more integrated circuits.

33. An amplifier architecture comprising:

A capacitive load circuit for providing an output voltage of a predetermined amplitude;

a first amplifier circuit, operable as a main amplifier, connected to the load circuit for powering the load circuit under normal operating condition; and a second amplifier circuit, operable as an auxiliary amplifier, connected to the load circuit for additionally powering the load circuit together with the main amplifier during relatively short intervals and where a relatively high slew rate is required for the output voltage;

wherein the load circuit includes a load capacitor which is charged by both said amplifier circuit; and wherein said second amplifier circuit includes a first auxiliary amplifier circuit which is active when the output voltage exceeds an input reference voltage and a second auxiliary amplifier which is active when the voltage falls below the input reference voltage.

34. An integrated circuit comprising:

a capacitive load circuit for providing an output voltage of a predetermined amplitude;

a first amplifier circuit, operable as a main amplifier, connected to the load circuit for powering the load circuit under normal operating condition; and a second amplifier circuit, operable as an auxiliary amplifier, connected to the load circuit for additionally powering the load circuit together with the main amplifier during relatively short intervals and where a relatively high slew rate is required for the output voltage;

wherein the load circuit includes a load capacitor which is charged by both said amplifier circuits; and wherein said second amplifier circuit includes a first auxiliary power amplifier circuit which is active when the output voltage exceeds an input reference voltage and a second auxiliary power amplifier which is active when the voltage falls below the input reference voltage.

35. A method of powering an intermittently used reference voltage source including a load capacitor, comprising the steps of:

supplying power to charge the load capacitor to a predetermined voltage from a first source of current during a first operational mode; and additionally supplying power to the load capacitor from a second source of current during a second operational mode occurring during intermittent relatively short time intervals where a relatively high slew rate of charge to said predetermined voltage is required; and said second source of current supplying charging current of a first polarity to the load capacitor when the voltage thereacross exceeds an input reference voltage and a second polarity when the voltage thereacross falls below the input reference voltage.

* * * * *